United States Patent [19]

Mensch, Jr.

[11] 3,968,478

[45] July 6, 1976

[54] CHIP TOPOGRAPHY FOR MOS INTERFACE CIRCUIT

[75] Inventor: William D. Mensch, Jr., Mesa, Ariz.

[73] Assignee: Motorola, Inc., Chicago, Ill.

[22] Filed: Oct. 30, 1974

[21] Appl. No.: 519,148

[52] U.S. Cl.............................. 340/172.5; 235/156; 307/213; 307/303
[51] Int. Cl.².................. G06F 13/00; H01L 25/00
[58] Field of Search................. 340/172.5; 307/213, 307/303; 235/156

[56] References Cited
UNITED STATES PATENTS

| | | | |
|---|---|---|---|
| 3,462,742 | 8/1969 | Miller et al. | 340/172.5 |
| 3,716,843 | 2/1973 | Schmitt et al. | 340/172.5 |
| 3,740,723 | 6/1973 | Beausoleil et al. | 340/172.5 |
| 3,745,532 | 7/1973 | Erwin | 340/172.5 |
| 3,760,367 | 9/1973 | Kortenhaus | 340/172.5 |
| 3,798,606 | 3/1974 | Henle et al. | 340/172.5 |
| 3,800,129 | 3/1974 | Umstattd | 235/156 |

*Primary Examiner*—Edward J. Wise
*Attorney, Agent, or Firm*—Harry M. Weiss; Charles R. Hoffman

[57] ABSTRACT

The chip architecture of an MOS peripheral interface adaptor chip includes data bus buffers arranged along one edge of the chip, peripheral interface buffers arranged along an opposite edge of the chip and a register section centrally located on the chip. Separate power supply buses are used to supply a ground voltage to the buffer and register sections. Data bus buffers are arranged to allow the pins of the enclosing semiconductor package to correspond to data bus pins of a separate microprocessor chip. Register sections are offset on the surface of the peripheral interface adaptor chip, in such a way as to facilitate nesting of the conductors coupled to the buffer circuit section. Identical buffer cells and custom drawn cells are both utilized so as to optimize use of semiconductor chip area.

8 Claims, 9 Drawing Figures

Fig. 8

| | | | | |
|---|---|---|---|---|
| Vss | 1 | | 40 | CA1 |
| PA0 | 2 | | 39 | CA2 |
| PA1 | 3 | | 38 | IRQA |
| PA2 | 4 | | 37 | IRQB |
| PA3 | 5 | | 36 | RS0 |
| PA4 | 6 | | 35 | RS1 |
| PA5 | 7 | | 34 | $\overline{RS}-$ |
| PA6 | 8 | | 33 | D0 |
| PA7 | 9 | | 32 | D1 |
| PB0 | 10 | | 31 | D2 |
| PB1 | 11 | | 30 | D3 |
| PB2 | 12 | | 29 | D4 |
| PB3 | 13 | | 28 | D5 |
| PB4 | 14 | | 27 | D6 |
| PB5 | 15 | | 26 | D7 |
| PB6 | 16 | | 25 | E |
| PB7 | 17 | | 24 | CS2 |
| CB1 | 18 | | 23 | $\overline{CS3}$ |
| CB2 | 19 | | 22 | CS1 |
| VDD | 20 | | 21 | R/W |

10F

CHIP TOPOGRAPHY FOR MOS INTERFACE CIRCUIT

BACKGROUND OF THE INVENTION

An important factor in the economical manufacture of MOSLSI integrated circuits is reducing the amount of silicon required to produce the chips. The surface geometry of the MOSFET devices and the interconnection pattern of conductors therebetween must be optimized to provide the highest functional component density in order to reduce overall chip area per circuit function. Minimum geometry spacings between metallization lines, diffused regions and polycrystalline silicon conductors must be maintained, yet the length of such lines and the associated capacitances must be minimized as complex interconnection patterns are implemented. Parasitic electrical effects on the circuitry must be minimized or compensated for in the chip layout. A very high degree of creativeness is required of the chip architect in order to choose a particular layout and interconnection pattern for an LSI circuit from the large number of possibilities that exist for arranging such a layout. Frequently, the commercial success of a MOSLSI product may hinge on the ability of the chip architect to achieve an optimum chip topography.

SUMMARY OF THE INVENTION

It is an object of this invention to provide a semiconductor chip topography for an interface circuit for MOS data processing systems.

It is another object of this invention to provide an MOSLSI peripheral interface adaptor chip topography including data circuit means disposed along a first edge of said chip, peripheral interface circuitry including buffer circuits disposed along second and/or third sides of said chip, and register circuit means disposed substantially between the data circuit means and the peripheral interface circuit means.

Briefly described, the invention is an MOSLSI interface chip having an optimum chip topography. The chip topography includes data circuit means disposed along the first edge of the chip, peripheral interface buffer circuits disposed along second and third edges of the chip and register circuitry disposed between the data circuit means and the peripheral interface circuitry. In a preferred embodiment of the invention, a voltage distribution conductor includes a first branch for supplying voltage to the register circuitry and a second branch for supplying voltage to the peripheral interface circuitry to reduce externally coupled noise at the register circuitry. The bonding pad sequence is selected to allow optimum arranging of packages containing the chips on a printed circuit board having a microprocessor chip package also mounted thereon.

BRIEF DESCRIPTION OF THE DRAWINGS

FIG. 8 is a drawing designating the external lead connections of a 40 pin dual-in-line package housing the peripheral interface adaptor chip illustrated in the preceeding drawing.

DESCRIPTION OF THE INVENTION

The subject matter described herein is related to that in copending patent application entitled "LOGIC STRUCTURE FOR A MULTI-PURPOSE PERIPHERAL INTERFACE ADAPTOR CIRCUIT FOR DATA PROCESSING SYSTEM", Ser. No. 519,138, filed on even date herewith and assigned to the assignee of the present invention.

The most modern MOSFET integrated circuit manufacturing processes, especially low threshold N-channel processes designed for operation with power supplies of 5 volts or less, present new problems with respect to noise immunity as compared with the older threshold N-channel or P-channel manufacturing processes. Although the voltage drops on the chip across the power supply conductors due to events such as short circuits, noise, etc. on the external leads of the package are small, nevertheless stored information in the MOS chip may be distributed by such external variations due to voltage variations coupled to the power distribution bus on the chip. According to the invention, separate voltage distribution conductors are therefore provided for the internal logic and for the buffers which drive external circuitry.

Figure 7:
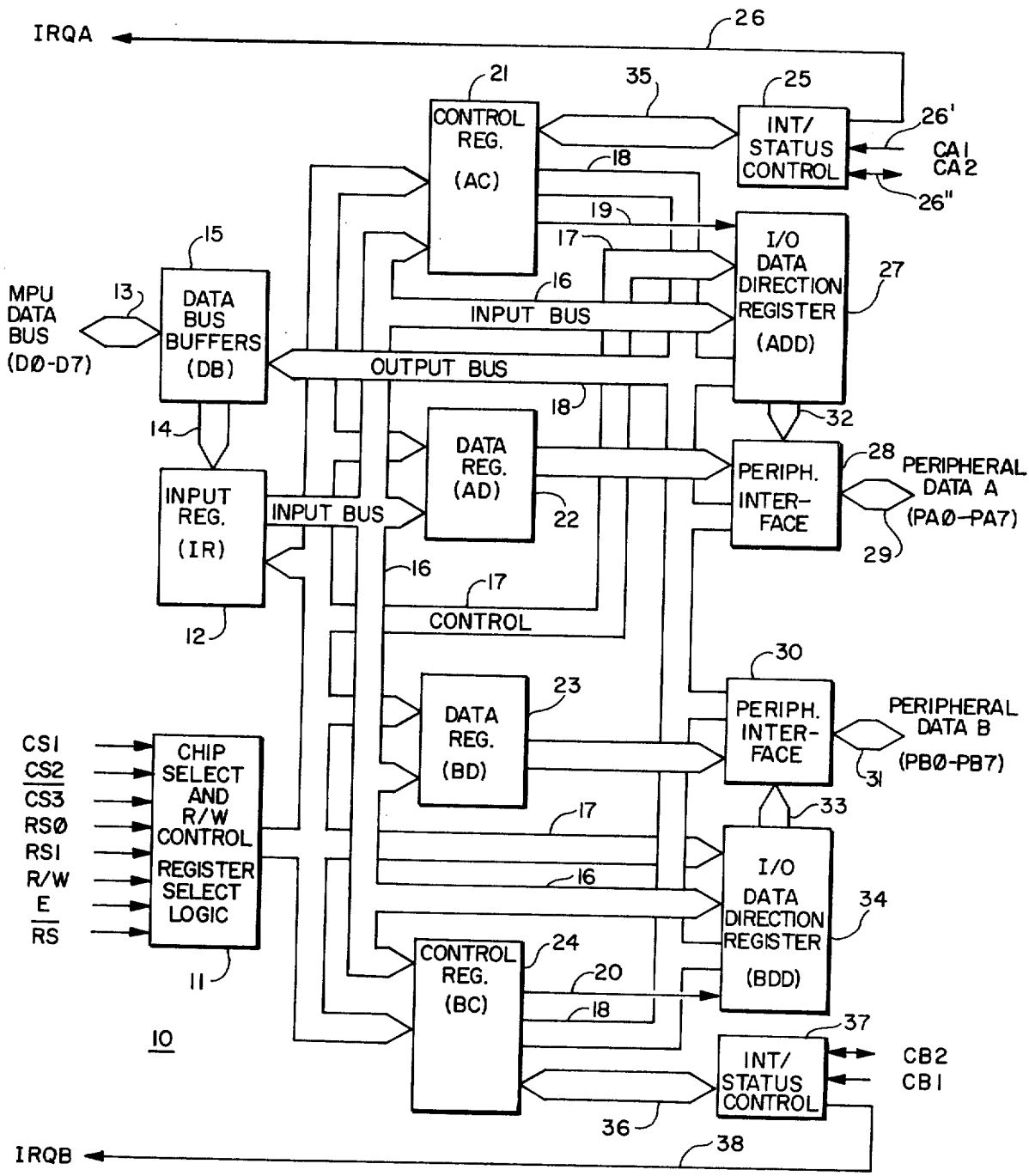
FIG. 7 is a block diagram of the peripheral interface adaptor circuit and includes the chip architecture described by the chip topography illustrated in FIGS. 1-6.

Referring to FIG. 7, which is a block diagram of a preferred embodiment of the peripheral interface adaptor according to the invention, peripheral interface adaptor 10 includes control circuitry, a plurality of registers, data buffer circuitry, peripheral interface circuitry, and three internal buses (an input bus, an output bus, and a control bus), an external data bus (D0–D7), hereinafter called the microprocessor data bus, or MPU data bus external, peripheral data bus A, (PA0–PA7), and external peripheral data bus B, (PB0–PB7). The input bus and the output bus each include eight separate conductors in a preferred embodiment of the invention. The control bus includes a plurality of control signal conductors which enable coupling circuitry between the various buses and registers. For a more complete description of the peripheral interface adaptor circuitry, see the above mentioned copending application.

Peripheral interface adaptor 10 includes MPU data bus 13 and data bus buffer circuits 15. Data bus buffer circuitry 15 is coupled to output bus 18 and is also coupled by means of conductors 14 to input register 12, which is coupled to input bus 16 and control conductors 17. Control bus conductors 17 are coupled to and controlled by Chip Select and Read/Write Control Circuitry 11, which has as its inputs the conductors designated CS1 (Chip Select 1), CS2, $\overline{CS3}$, RS0 (Register Select), RS1, R/W (read/Write), E (Enable), and $\overline{RS}$ (Reset). Peripheral interface adaptor 10 also includes control registers 21 and 24, each of which are coupled to input bus 16, output bus 18 and certain of the control conductors 17. Control register 21 is coupled by means of conductors 35 to Interrupt/Status Control circuitry 25, which is coupled to conductor 26, designated IRQA and to conductors 26' and 26" designated CA1 and CA2, respectively. IRQA is an abbreviation for "Interrupt Request for Register Section A". Control register 21 is also coupled by conductor 19 to I/O control register 27. (I/O is an abbreviation for Input/Output. I/O control register 27 is also coupled to output bus 18, input bus 16 and control conductors 17, and is coupled by means of conductors 32 to the peripheral interface buffers 28, which are respectively connected to the conductors of peripheral data bus A, designated by reference number 29 and coupled to data register 22 and output bus 18. Data register 22 is also coupled to control conductors 17 and input bus 16.

Control register 24, data register 23, peripheral interface buffer circuitry 30, I/O control register 34, and interrupt/status control circuitry 37 are interconnected in a manner entirely similar to the corresponding sections described above. Data register 23 is coupled to input bus 16, control conductor 17, and is connected to peripheral interface circuitry 30, which in turn is coupled to external peripheral data bus conductors B, designated by reference numeral 31, and to output bus 18 and to I/O control register 34. I/O control register 34 is coupled to certain control conductors 17, input bus 16, and output bus 18. Control register 24 is coupled to input bus 16, certain control conductors of control bus 17, output bus 18, and conductor 20, the latter being coupled also to I/O control register 34. Control register 24 is also coupled by means of conductors 36 to interrupt/status control circuitry 37, which is connected to conductors CB1, CB2, and IRQB conductor 38.

Figure 1:
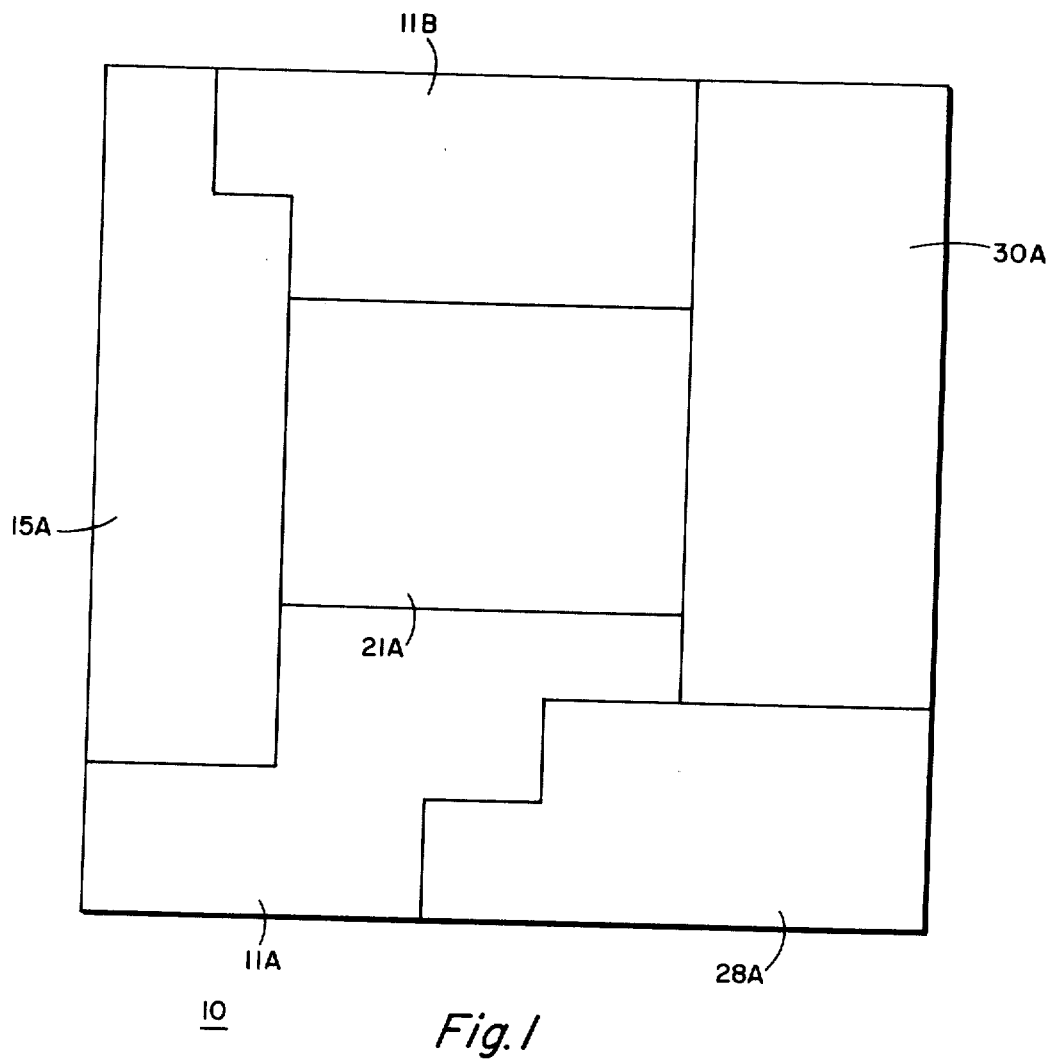
FIG. 1 is a block diagram illustrating the general location on a semiconductor chip of a peripheral interface adaptor circuitry according to the invention.

FIG. 1 is a drawing showing the topography of peripheral interface circuit 10 and includes data bus buffers 15A generally situated on the surface of chip 10 along the righthand edge thereof. Register section 21A, which includes registers 21, 22, 23, 24, 27, and 34 of FIG. 7, described above, is centrally located on the surface of chip 10, between data bus buffer section 15A and the "side B" peripheral data buffers which are generally situated in section 30A along the righthand edge of chip 10. Peripheral data buffers PB0–PB7 are generally situated in section 28A along the bottom edge and towards the righthand side of chip 10. The remaining circuitry in the chip is situated in sections 11A and 11B and include the interrupt/status control circuitry, the chip selection circuitry the Read/Write control circuitry, and the register selection circuitry.

Figure 2:
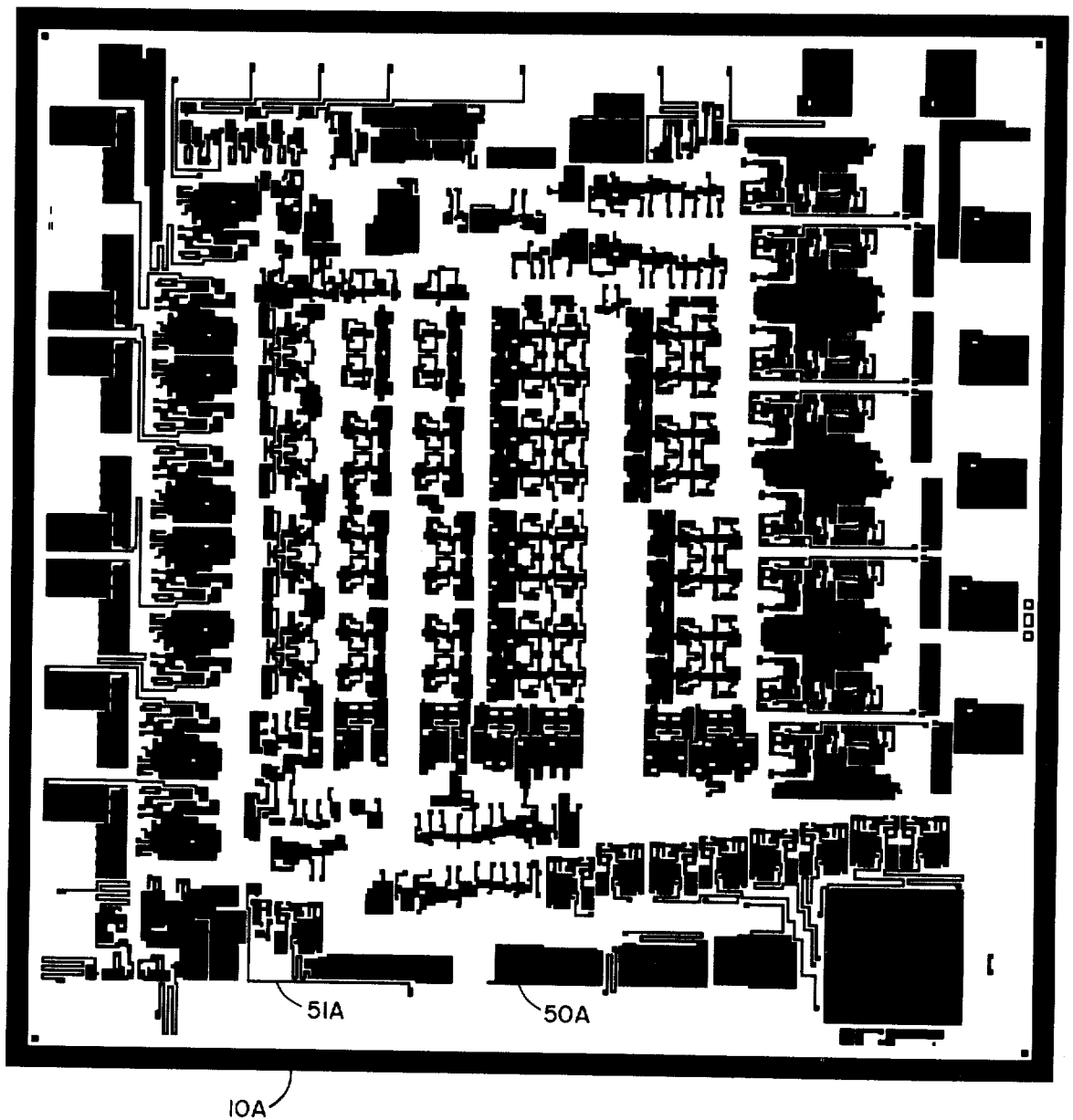
FIG. 2 is a scale drawing of a photomask utilized to pattern the source-drain diffusion step in the manufacture of a peripheral interface adaptor circuit according to the invention.

FIG. 2 is a drawing of the source-drain diffusion mask 10A utilized in manufacturing the presently preferred embodiment of the invention for an N-channel silicon gate MOS manufacturing process. The darkened areas on a chip such as area 50A designate the source, the drain region and the channel regions of the subsequently formed MOSFET. The long, slender lines, such as 51A, designate diffused conductors.

Figure 3:
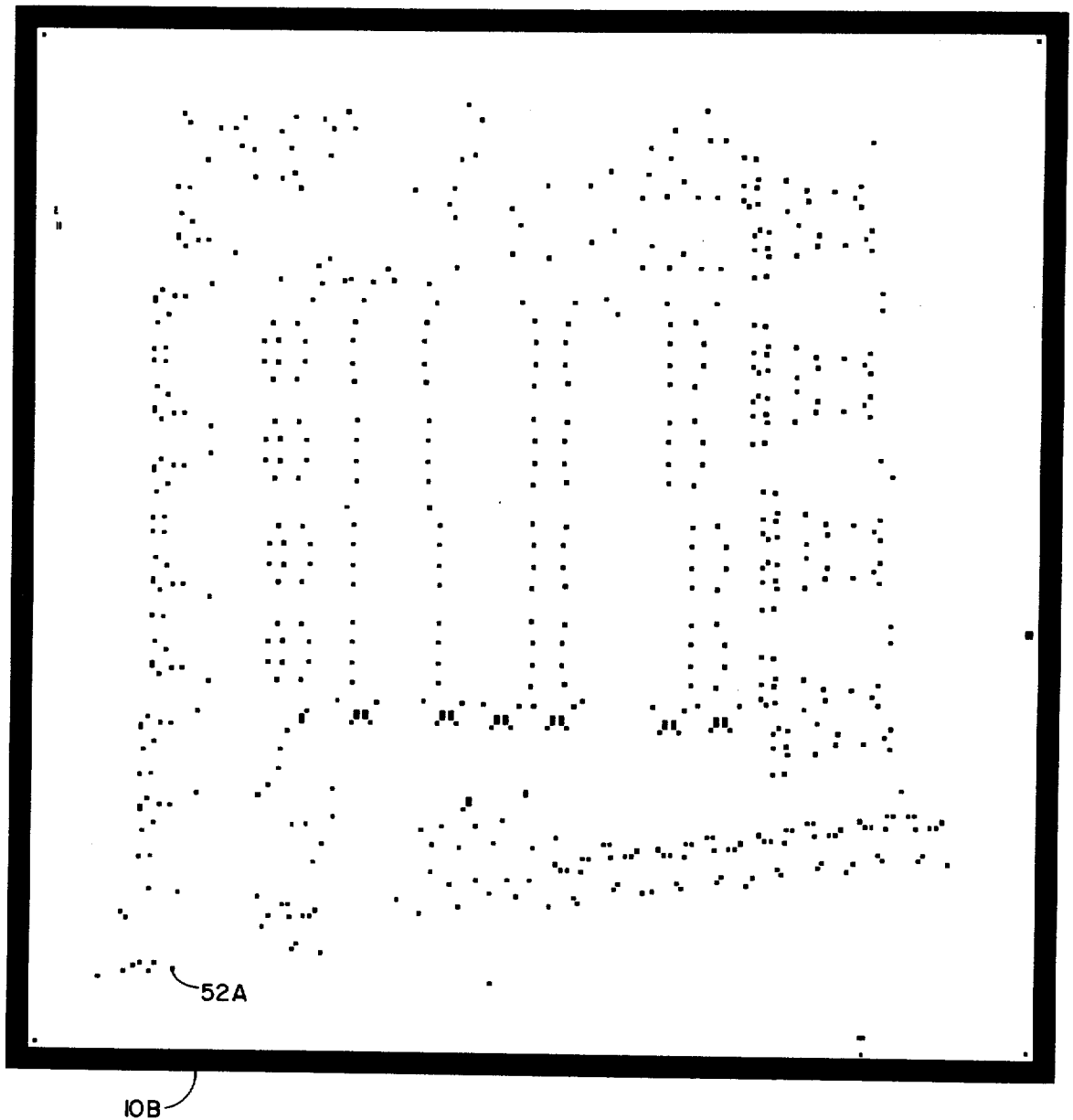
FIG. 3 is a scale drawing of a polycrystalline silicon-to-source-drain diffusion preohmic contact mask used in manufacture of a peripheral interface adaptor circuit according to the invention.
Figure 4A:
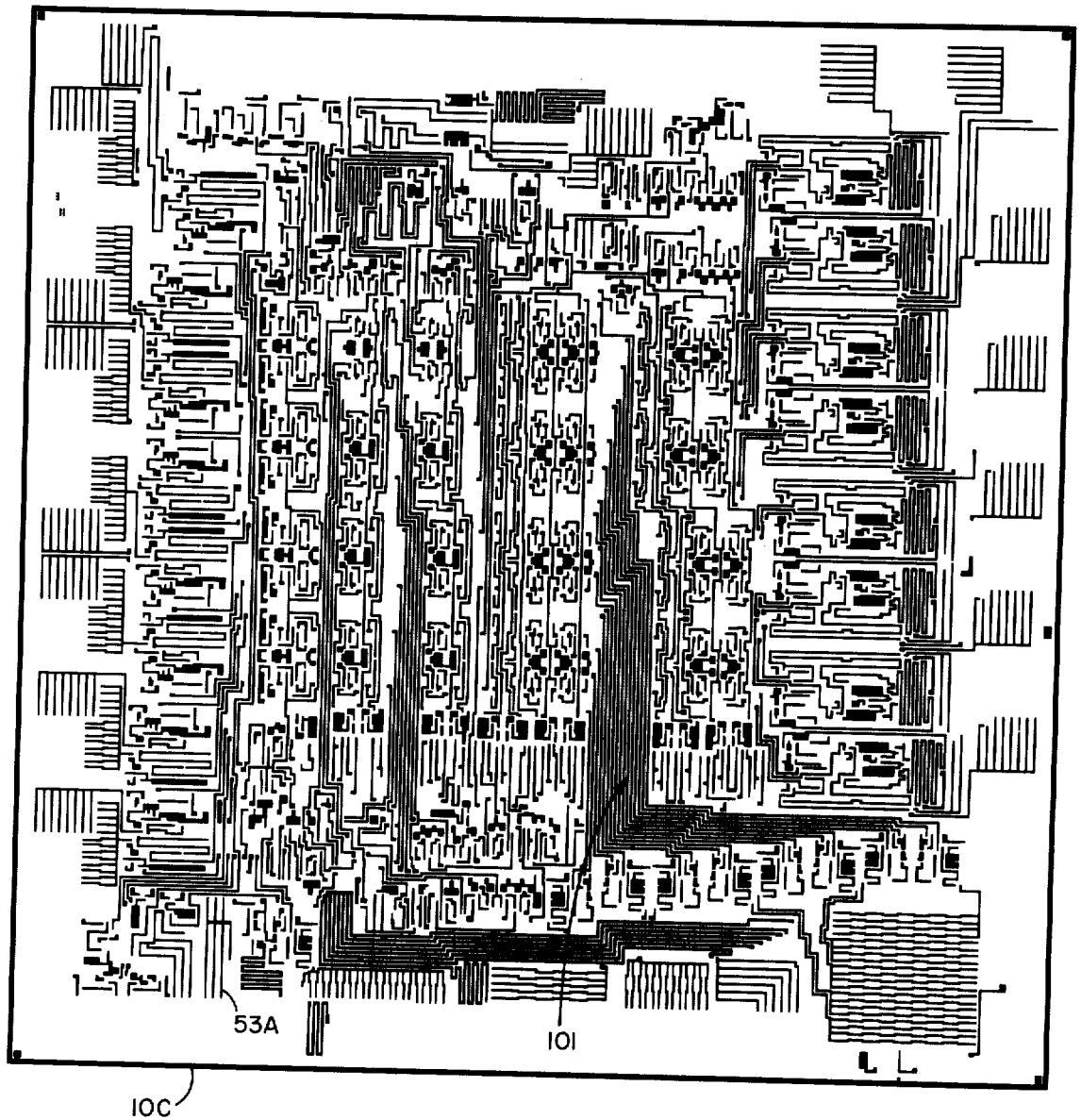
FIG. 4A is a scale drawing of a photomask used to pattern the polycrystalline silicon layer of a peripheral interface adaptor chip according to the invention.
Figure 5:
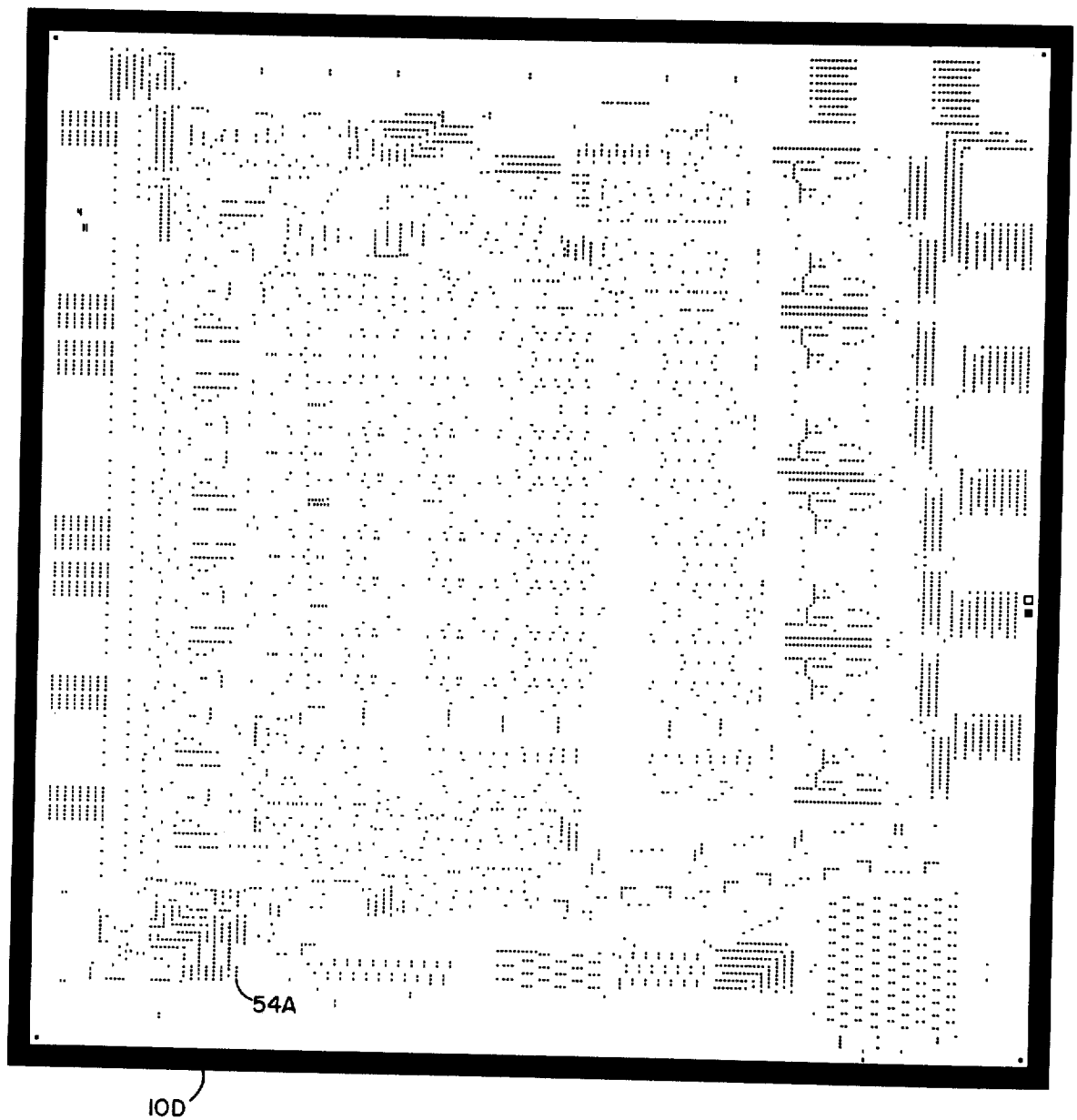
FIG. 5 is a scale drawing of a photomask used to pattern the preohmics during the manufacture of a peripheral interface adaptor chip according to the invention.
Figure 6:
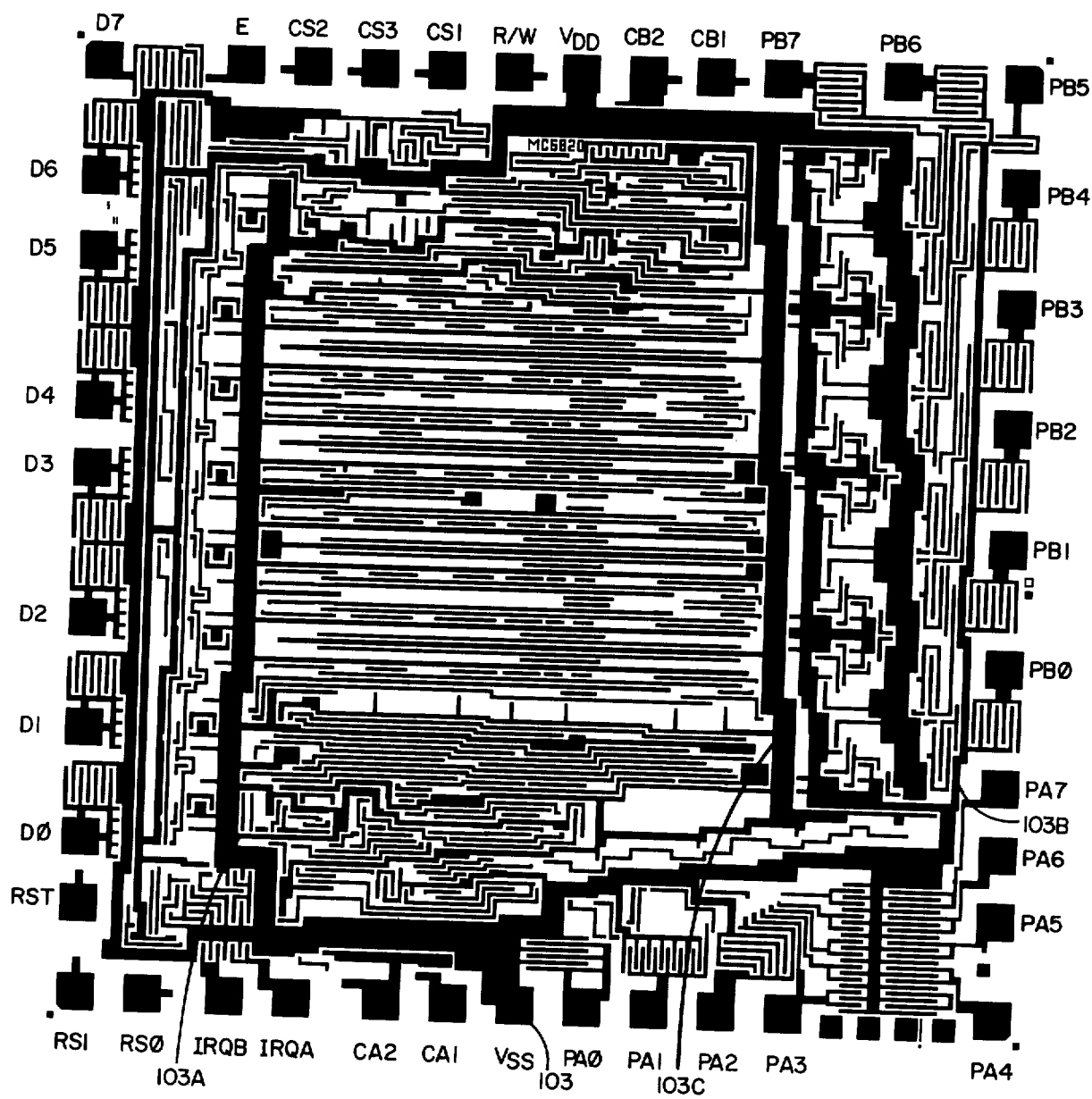
FIG. 6 is a scale drawing of a photomask used to pattern the metal interconnection layer of a peripheral interface adaptor chip according to the invention.

The first preohmic mask 10B is illustrated in FIG. 3, and is applied in the manufacturing process after the source-drain mask in FIG. 2 is applied and after the polycrystalline silicon mask shown in FIG. 4A is applied. The darkened areas such as 52A indicate where polycrystalline silicon-to-diffused region contacts are made. After the oxide initially on the semi-conductor wafer is patterned using mask 10A of FIG. 2, an oxide is thermally grown in the regions where silicon is exposed as a result of application of mask 10A. Then polycrystalline silicon is deposited on the entire wafer, and mask 10C, in FIG. 4A is applied to pattern the polycrystalline silicon and the underlying oxide and the source-drain-channel region. The darkened regions, such as 53A in FIG. 4A represent either gate electrodes of MOSFETs or polycrystalline conductors. For example, the conductors 101 are not gate electrodes, but instead are polycrystalline lines utilized as interconnection conductors. Mask 10D, shown in FIG. 5, is applied after the source and drain regions and the polycrystalline conductors are diffused. The dark spots, such as 54A in FIG. 5 indicate where the subsequent metallization pattern, defined by mask 10E in FIG. 6, is required to contact either polycrystalline silicon conductors or diffused silicon conductors. The metallization interconnection pattern 10E, as previously mentioned, defines the metal interconnection pattern for the peripheral interface chip according to the invention. The information disclosed by FIG. 2–6 discloses the geometry and interconnections of all MOSFETs of the peripheral interface adaptor circuit described as a preferred embodiment herein.

Figure 4B:
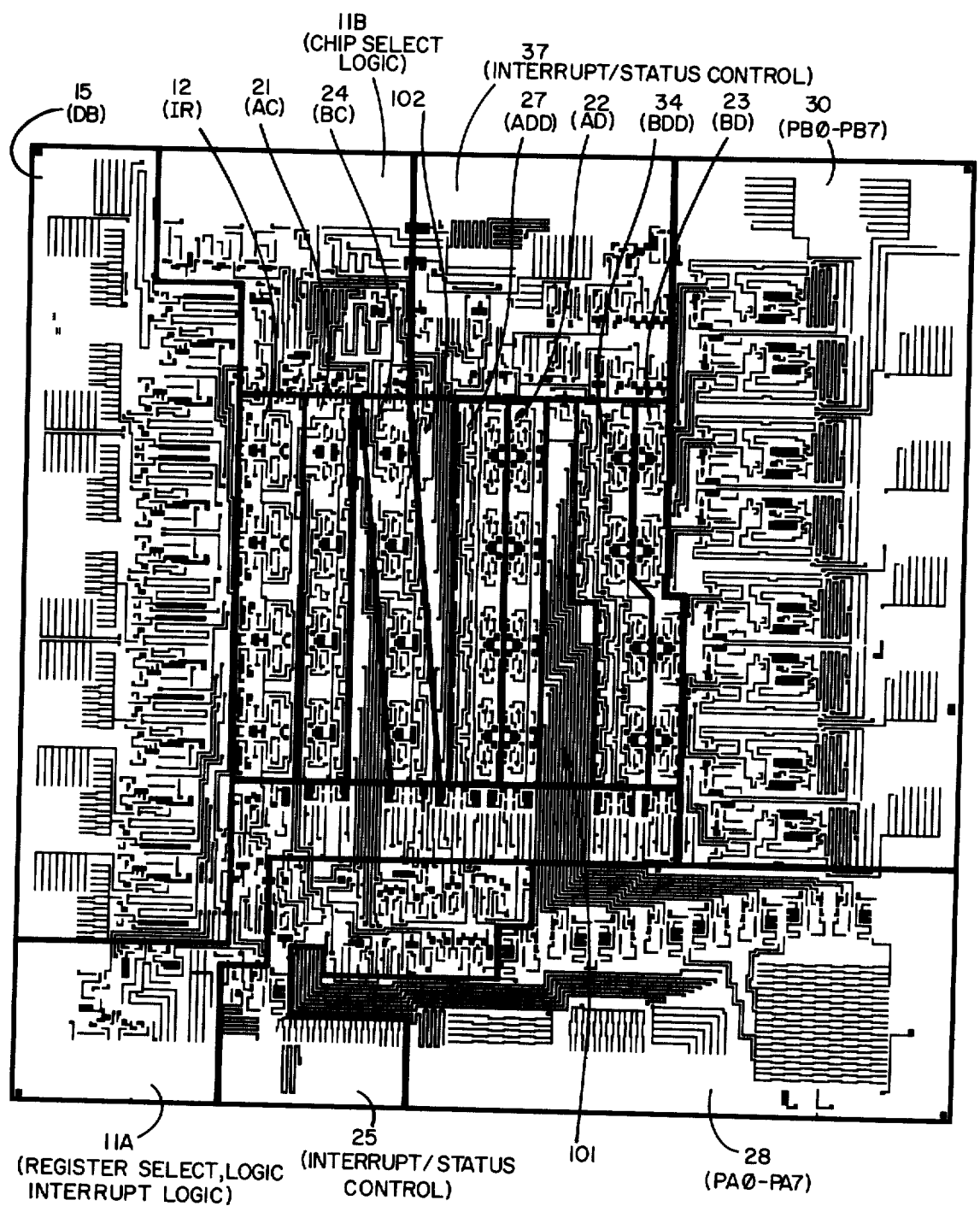
FIG. 4B is a scale drawing identical of FIG. 4A, except that some of the sections illustrated in FIG. 7 are blocked out with heavy lines.

The "B" side data buffers 30 are located adjacent to the righthand edge of the chip in FIG. 4B because they are repetitive cells which could acceptably be slower according to the specification for the chip. Use of repetitive "cells" in the design of an LSI chip is an important consideration because there may be a considerable savings in layout time achieved by use of cells. Further, there is a substantially reduced probability of an artwork error when repetitive "cells" are used instead of utilizing a "custom" approach to the artwork for each cell. On the other hand, use of standard cells for all of the logic on a MOSLSI chip is very unlikely to make optimum use of the chip area. Further, standard "cells" are likely to be overdesigned for some on-chip applications and underdesigned for others, depending on the speed required at the particular stage of the circuit and the capacitance of the line that the cell is required to drive. However, creative use of some repetitive "cells" in combination with custom art work for other sections of the chip may provide an optimum chip topology which will make possible high yield and good circuit performance and require a minimum amount of silicon.

The "A side" data buffers (PA0–PA7) are shown on the lower right hand corner of FIG. 4B and are designated by reference numeral 28. The topology of this "A" buffer is achieved by "customer layout," i.e., non-repetitive layout in order to optimally utilize the silicon in this section of the chip. The bonding pad locations required by the specification and shown in FIG. 8 determined the general relationship of the b side data buffers 28 (PB0–PB7) and A side data buffers 30 (PA0–PA7).

It should be noted that the conductors 101 running from the register section to the A side data buffers on the B side data buffers are polycrystalline silicon. Polycrystalline silicon conductors were chosen because of the large number of conductors required and because for the utilized silicon gate process narrower center-to-center spacings are required for polycrystalline silicon conductors than for metal or diffused conductors. Since the capacitance of the A side and B side data buffer inputs is relatively low, the resistance of the polycrystalline silicon conductors did not cause appreciable RC/time constant type delays. These considerations made use of polysilicon crystalline conductors from the register section to the A and B side buffers the best choice.

Once the direction of a plurality of polycrystalline silicon conductors of substantial length is selected, for reasons such as those listed above, it is largely settled that diffused conductors, where they are used must go in a substantially parallel path, as must other polycrystalline silicon conductors, since neither other polycrystalline silicon conductors nor diffused conductors can cross said polycrystalline silicon conductors. In the subject case, the selection of polycrystalline silicon of the above mentioned conductors established that many metal conductors would have to be used in a horizontal direction, as is clear from the metallization mask shown in FIG. 6, wherein the majority of the metal conductors are horizontal.

It should be noted with reference to FIG. 4B that the B data direction register (BDD) and the B data register (BD) each have an upper section and a lower section offset from the upper section so as to accommodate the increasing number of parallel polycrystalline silicon conductors 101 in the direction from the top to the bottom of the register section. This further facilitates the routing of the polycrystalline silicon conductors going to the B side data buffer PB0–PB7.

The A data direction register (ADD) and A data register AD are all vertically well aligned as shown in FIG. 4A. However, the cells comprising the B control register (BCO) are offset to accommodate the increasing number of parallel polycrystalline silicon conductors from the bottom to the top of the register section. The vertical alignment of the control registers (AC) and the data input latches (IR) is essentially straight up and down because essentially the same number of polycrystalline silicon conductors run along the length of this section.

It should be noted that substantially similar repetitive cells are used for the data bus buffers (DB) aligned adjacent to the right hand edge of the chip.

A very high level of creativity is required of the chip architect in designing MOSLSI random logic chips such as are used in microprocessor or peripheral interface adaptor chips and the like because of the layout constraints for state-of-the-art manufacturing processes. For example, for silicon gate MOS manufacturing processes the major constraints are the minimum widths and spacing of the diffused regions, the minimum size required for preohmic openings and the spacings required from the edge of the peripheral ohmic openings to the edge of the diffused regions, the minimum width and spacing of polycrystalline silicon lines and the fact that such lines cannot cross over diffused regions, and the minimum width and spacing between the metal lines, and of course the fact that conductors in the same layer, i.e., diffused regions, polycrystalline silicon lines, or metallization lines cannot cross like conductors. The high amount of capacitance associated with diffused regions and the resistance of both diffused lines and polycrystalline silicon lines and to a less extent of metal lines provide further constraints on the chip architect. For logic circuits which may be characterized as random logic such as those in the subject invention, a large number of lines between sections of logic circuitry are required and a very large number of possibilities for routing the various kinds of conductors to the various required sections of the chip taxes the ingenuity of the most competent chip topology architect and the capacity of the most sophisticated computer routing programs yet available. The computer aided design (CAD) approach has been applied to computerized random logic MOS LSI layouts for a number of years. However, it has been successful only to the extent that it provides rapid prototype designs having rather mediocre performance and uneconomically large semiconductor chips. It is well established that the CAD programs currently available do not come close to matching human ingenuity in providing MOS LSI chip architectures which provide optimum performance while utilizing minimum silicon area. Clearly, there is a great deal of room for a high level of creativity in the design of MOS LSI chips. Yet, the economic rewards for success are substantial.

Other constraints faced by the chip architect are related to the environment in which the chip is expected to operate. For example, a chip expected to operate in a high noise environment may have substantial amounts of noise coupled into the various conductors within the chip. In the chip of subject invention, the N-channel MOS manufacturing process utilized has relatively low threshold voltages, of the order of 1 volt as opposed the high voltage threshold voltages of 2–4 volts for earlier MOS manufacturing processes. The lower noise immunity of the N-channel MOS threshold voltages means that less noise may be coupled from conductors external to the chip to the logic circuitry within a chip. To help offset this difficulty, the ground ($v_{ss}$) power disbribution bus 103, FIG. 6, of the peripheral interface adaptor was routed into several "branches", 103, 103A and 103C, so that current variations caused in the branches supplying current to the data buffers PB0–PB7 and PA0–PA7 and the data bus buffers D0–D7 would not be coupled to a circuitry in the register section, which is coupled to branch 103A.

A forty pin dual-in-line semiconductor package suitable for housing the peripheral interface adaptor chip described herein is illustrated in FIG. 8. A preferred sequence of external pin assignments is also illustrated in FIG. 8. The sequence of the pins is chosen to provide maximum utility in placing peripheral interface adaptors on an integrated circuit board. It is desirable that the $V_{ss}$ and $V_{DD}$ voltage supply pins not be located close to each other to avoid shorts. It is also desirable that they not be symetrically located on the package so that if the package is inserted backward into the PC board with power applied damage to the semiconductor chip may be avoided. It is also desirable that the data input-output pins D0–D7 be sequentially numbered and also that the peripheral bus output pins PA0–PA7 and PB0–PB7 be sequentially located. It is also desirable that the peripheral bus input-output pins all be on the same side of the dual-in-line package 10F so that conductors on the printed circuit board can be easily routed to the printed circuit board connectors which in an operating system would be connected to cables interfacing with peripheral devices, such as line printers, plotters, display units, etc. Provision of the data bus pins on the opposite side of package 10F allows optimum routing of the system bidirectional data bus to a plurality of peripheral interface adaptor units which may be on the same printed circuit board, along with the microprocessing unit, such as is described in copending patent applications "Integrated Microprocessor Architecture", Ser. No. 519,150 and "Micro-processing Unit System", Ser. No. 519,149 assigned to the assignee of the present invention and filed on even date herewith.

While the invention has been described with reference to several embodiments thereof, those skilled in the art will recognize that the changes in form and placement of parts may be made to suit varying requirements within the scope of the invention.

What is claimed is:

1. An MOS peripheral interface adaptor chip comprising:

peripheral interface circuitry on a surface of said MOS peripheral interface adaptor chip adapted to be coupled to external peripheral devices by means of an external bidirectional peripheral data bus for sending data to and receiving data from said external peripheral devices;

data bus interface circuitry on said surface adapted to be coupled to an external bidirectional data bus of a data processing system for receiving data from and sending data to said data processing system;

register circuitry means on said surface coupled to said data bus interface circuitry for receiving data from said data bus interface circuitry for controlling a direction of data on a conductor of said external bidirectional peripheral data bus independently of the direction of data on another conductor of said external bidirectional peripheral data bus; and said data bus interface circuitry including data input-output circuits disposed along a first edge of said MOS peripheral interface adaptor chip, said peripheral interface circuitry including buffer circuits disposed along second and third edges of said MOS peripheral interface adaptor chip, and said third edge of said chip being opposite said first edge, said register circuitry being disposed substantially between said data bus interface circuitry and said peripheral interface circuitry.

2. An MOS chip as recited in claim 1 further including metal voltage conductor means on said surface of said chip, said voltage conductor means including a first branch for supplying voltage to said register circuitry means and a second branch for supplying voltage to said peripheral interface circuitry.

3. An MOS peripheral interface adapter chip comprising control register circuitry, input-output control register circuitry, data register circuitry, peripheral interface buffer circuitry, chip select circuitry, read/write control circuitry, input register circuitry, interrupt and status control circuitry, output bus means, input bus means, and control bus means all on a surface of said chip, said input bus means being coupled to said input-output register circuitry, said control register circuitry, said input-output control register circuitry, and said data register circuitry, said output bus means being coupled to said data bus buffer circuitry, said input-output control register circuitry, said control register circuitry, and said peripheral interface buffer circuitry said control bus means being coupled to said input register circuitry, said control register circuitry and said input-output control register circuitry, said data bus buffer circuitry being located generally along the left hand edge of said MOS chip, said chip select circuitry being located in the upper lefthand section of said MOS chip, said interrupt and status control circuitry being substantially located in the upper central portion of said MOS chip, said peripheral interface circuitry being located substantially along the righthand edge and the lower righthand edge of said MOS chip, said control register circuitry, said data register means, and said input-output control register circuitry being located centrally on said MOS chip.

4. The MOS peripheral interface adaptor chip as recited in claim 3 wherein said input/output control register circuitry includes a first input/output control register and a second input/output control register, said data register circuitry includes a first data register and a second data register, said peripheral interface buffer circuitry includes sixteen peripheral interface buffer circuits, said data bus buffer circuitry includes eight data bus buffer circuits, said first data register and said first input/output control register being coupled to eight of said peripheral interface buffer circuits, said second data register and said second input/output control register being coupled to said other eight peripheral interface buffer circuits.

5. The MOS peripheral interface adaptor chip as recited in claim 4 wherein said one of data registers is offset to the left with respect to the other of said registers to facilitate routing of polycrystalline silicon conductors from said data registers to said peripheral interface buffer circuits.

6. A peripheral interface adaptor device as recited in claim 5 in a dual-in-line semiconductor package wherein a $V_{DD}$ pin is not symmetrically located opposite to a VSS pin to prevent damage to said MOS peripheral interface adaptor chip if said semiconductor package is improperly inserted into a printed circuit board.

7. The MOS peripheral interface adaptor circuit as recited in claim 4 wherein said circuitry is N-channel silicon gate circuitry.

8. An MOS peripheral interface adaptor chip comprising data buffer circuit means, peripheral interface buffer circuit means, register means, and control circuit means coupled to a plurality of bonding pads on a surface of said MOS interface adaptor chip, said MOS interface adaptor chip having first, second, third and fourth edges located in a counter-clockwise sequence around the periphery of said MOS peripheral interface adaptor chip, said bonding pads being arranged along said periphery of said MOS interface adaptor chip in a sequence counter-clockwise from a first voltage supply bonding pad $V_{SS}$, said first voltage supply bonding pad $V_{SS}$ being located substantially centrally along said first edge, including, respectively, a plurality of peripheral data bus bonding pads PA0, PA1, PA2, PA3, PA4, PA5, PA6 coupled to a first peripheral interface circuit of said peripheral interface buffer circuit means, a plurality of peripheral interface bonding pads PB0, PB1, PB2, PB3, PB4, PB5, PB6, PB7 coupled to a second peripheral interface circuit of said peripheral interface buffer circuit means, a second voltage supply bonding pad $V_{DD}$, a read-write bondng pad R/W, three chip select bonding pads CS1, $\overline{CS3}$, CS2, and a chip enable bonding pad E and a plurality of data bus bonding pads D7, D6, D5, D4, D3, D2 D0 coupled to said data buffer circuit means, three register selection bonding pads $\overline{RS}$, RS1 and RS0 coupled to said control circuit means, two interrupt request bonding pads IRQB, IRQA coupled to said control circuit means, and two control bonding pads CA2, CA1 coupled to said control circuit means.

* * * * *